(12) United States Patent
Oh et al.

(10) Patent No.: US 9,165,609 B2
(45) Date of Patent: Oct. 20, 2015

(54) SEMICONDUCTOR DEVICE

(71) Applicant: SK hynix Inc., Icheon-si (KR)

(72) Inventors: Sung Lae Oh, Cheongju-si (KR); Dae Hun Kwak, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/314,493

(22) Filed: Jun. 25, 2014

(65) Prior Publication Data

US 2015/0199998 A1    Jul. 16, 2015

(30) Foreign Application Priority Data

Jan. 14, 2014    (KR) .................. 10-2014-0004651

(51) Int. Cl.
*G11C 5/06* (2006.01)
*G11C 5/02* (2006.01)
*H01L 23/528* (2006.01)

(52) U.S. Cl.
CPC .. *G11C 5/06* (2013.01); *G11C 5/02* (2013.01); *G11C 5/025* (2013.01); *H01L 23/528* (2013.01); *H01L 2224/73265* (2013.01)

(58) Field of Classification Search
CPC ............. H01L 2224/73265; H01L 27/11551; H01L 23/528; H01L 21/8221; G11C 16/0483; G11C 5/02; G11C 2213/71; G11C 5/025
USPC ............ 365/63, 51, 185.17, 185.11; 257/774, 257/777
See application file for complete search history.

(56) References Cited

U.S. PATENT DOCUMENTS 8,817,512 B2 *    8/2014    Kono ............................ 365/51

FOREIGN PATENT DOCUMENTS

KR    1020110095697 A    8/2011

* cited by examiner

*Primary Examiner* — David Lam
(74) *Attorney, Agent, or Firm* — William Park & Associates Ltd.

(57) ABSTRACT

A semiconductor device includes a first set of stacked structures including alternately stacked insulating layers and conductive layers disposed on a substrate, and arranged in a generally parallel configuration with respect to each other, a second set of stacked structures including alternately stacked insulating layers and conductive layers disposed on the substrate between the first stacked structures, and arranged in a generally parallel configuration with respect to each other, a first wiring structure configured to electrically couple conductive layers located on the same layer in different stacked structures of the first set of stacked structures, a second wiring structure configured to electrically couple conductive layers located on the same layer in different stacked structures of the second set of stacked structures, and a third wiring structure configured to electrically couple the first wiring structure and the second wiring structure with an operation circuit.

17 Claims, 14 Drawing Sheets

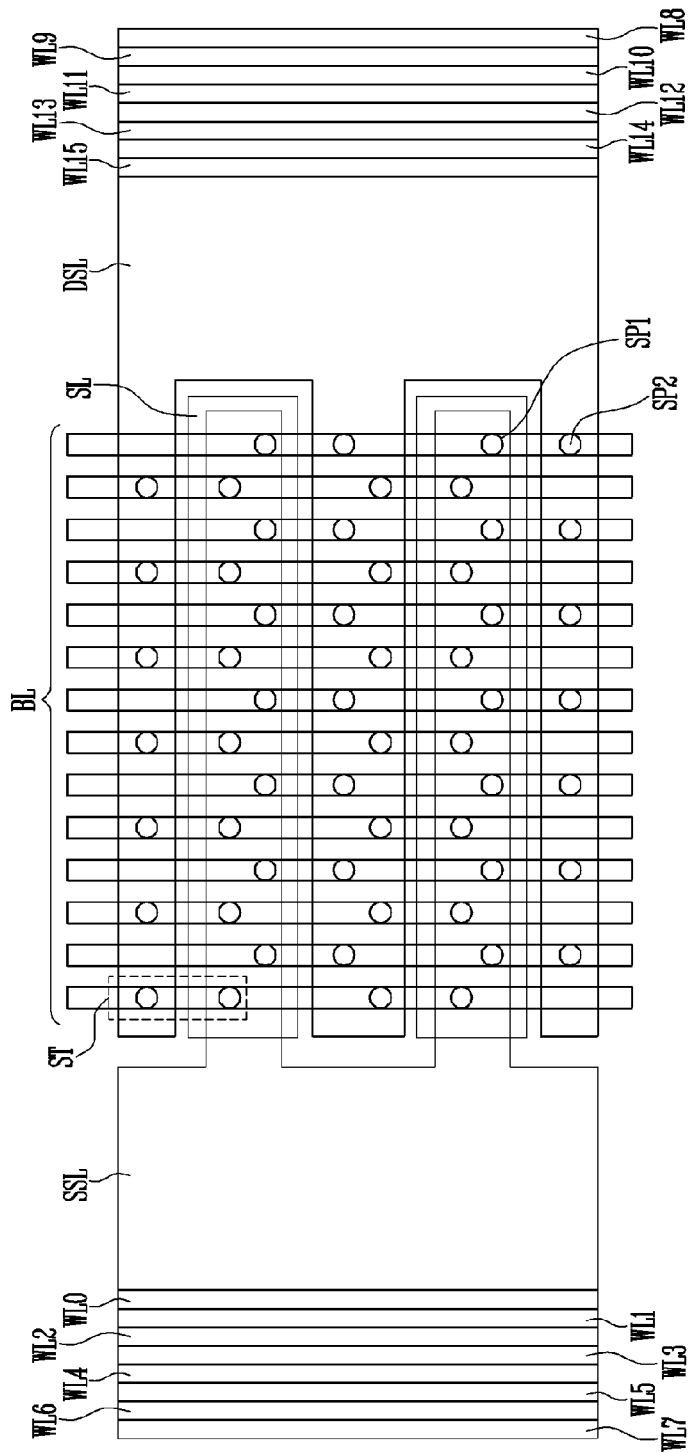

SEMICONDUCTOR DEVICE

CROSS-REFERENCE TO RELATED APPLICATION

The present application claims priority to Korean patent application number 10-2014-0004651 filed Jan. 14, 2014, in the Korean Intellectual Property Office, the entire disclosure of which is incorporated by reference herein.

BACKGROUND

1. Technical Field

Various embodiments relate to a semiconductor device, and more particularly, to a semiconductor device having a memory block.

2. Related Art

Methods for incorporating an operation circuit into a semiconductor memory system may change based on a structure of one or more memory blocks disposed within the semiconductor memory system. For example, an operation circuit may be incorporated differently into a memory device including memory blocks having a 2-dimensional structure when compared to a memory device including memory blocks having a 3-dimensional structure. In many cases, a drain select line and a source select line may be stacked with word lines in different areas from each other.

SUMMARY

An embodiment of a semiconductor device includes a first set of stacked structures including alternately stacked insulating layers and conductive layers disposed on a substrate, and arranged in a generally parallel configuration with respect to each other, a second set of stacked structures including alternately stacked insulating layers and conductive layers disposed on the substrate between the first stacked structures, and arranged in a generally parallel configuration with respect to each other, a first wiring structure configured to electrically couple conductive layers located on the same layer in different stacked structures of the first set of stacked structures, a second wiring structure configured to electrically couple conductive layers located on the same layer in different stacked structures of the second set of stacked structures, and a third wiring structure configured to electrically couple the first wiring structure and the second wiring structure with an operation circuit.

An embodiment of a semiconductor device includes a first memory group including first and second set of stacked structures insulating layers and conductive layers alternately stacked on a substrate, and the stacked structures in the first set of structures and the stacked structures in the second set of structures are alternately arranged and wherein the stacked structures of the first set of stacked structures has a generally parallel configuration and the stacked structures of the second set of stacked structures has a generally parallel configuration, first and second wiring structures configured to electrically couple conductive layers located on the same layer in different stacked structures of the first set of stacked structures and to electrically couple conductive layers located on the same layer in different stacked structures of the second set of structures, respectively, a second memory group including third and fourth set of stacked structures including insulating layers and conductive layers alternately stacked on the substrate, and the stacked structures of the third set of stacked structures and the stacked structures of the fourth set of stacked structures are alternately arranged and wherein the stacked structures of the third set of stacked structures has a generally parallel configuration and the stacked structures of the fourth set of stacked structures has a generally parallel configuration, fourth and fifth wiring structures configured to electrically couple conductive layers located on the same layer in different stacked structures of the third set of stacked structures, and to electrically couple conductive layers located on the same layer in different stacked structures of the fourth set of stacked structures, respectively, a third wiring structure configured to electrically couple the first and second wiring structures with an operation circuit located between the first and second memory groups, and a sixth wiring structure configured to electrically couple the fourth and fifth wiring structures with the operation circuit.

BRIEF DESCRIPTION OF THE DRAWINGS

FIG. 3 is a plan view of a memory block of an embodiment of a semiconductor device;

DETAILED DESCRIPTION

Various embodiments will be described with reference to the accompanying drawings.

Figure 1:
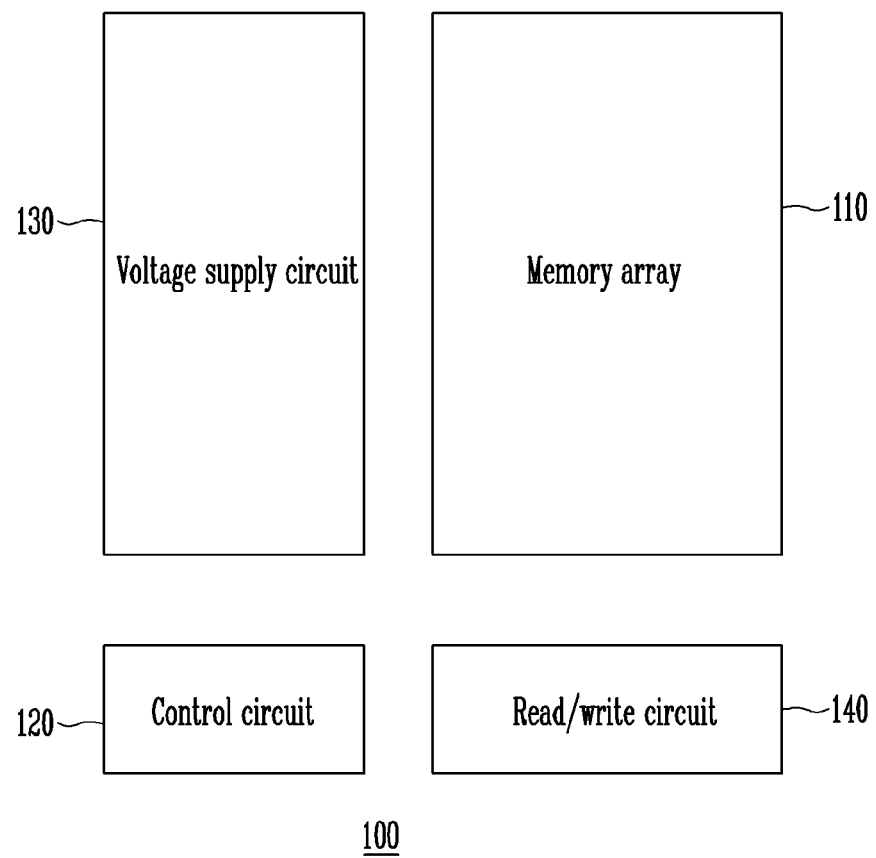
FIG. 1 is a block diagram representation of an embodiment of a semiconductor memory device.

Referring to FIG. 1 a block diagram representation of an embodiment of a semiconductor memory device is shown.

The semiconductor memory device 100 includes a memory array 110 and operation circuits 120, 130, 140. The memory array 110 includes a plurality of memory blocks. Each of memory blocks includes a plurality of memory strings. Each of memory strings includes a plurality of memory cells. In a flash memory device, a memory block may include a flash memory cell. For example, a memory block may include flash memory cells having a polysilicon floating gate or a nitride charge storage layer.

The memory block may include memory strings electrically coupled via bit lines. The memory strings may be electrically coupled with a source line in a parallel configuration. The memory strings may be formed as a 2-dimensional structure or as a 3-dimensional structure on a semiconductor substrate. A memory block having the memory strings formed as a 3-dimensional structure will be described below.

Figure 2A:
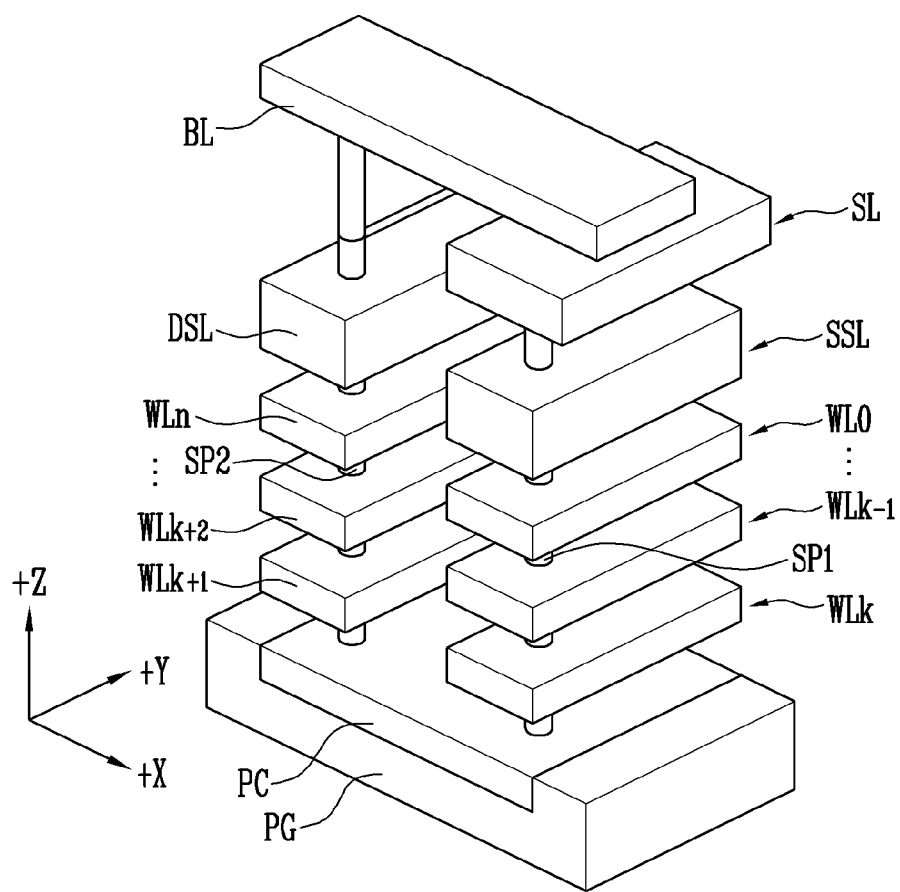
FIGS. 2A and 2B are views of a memory string of the memory block shown in FIG. 1.
Figure 2B:
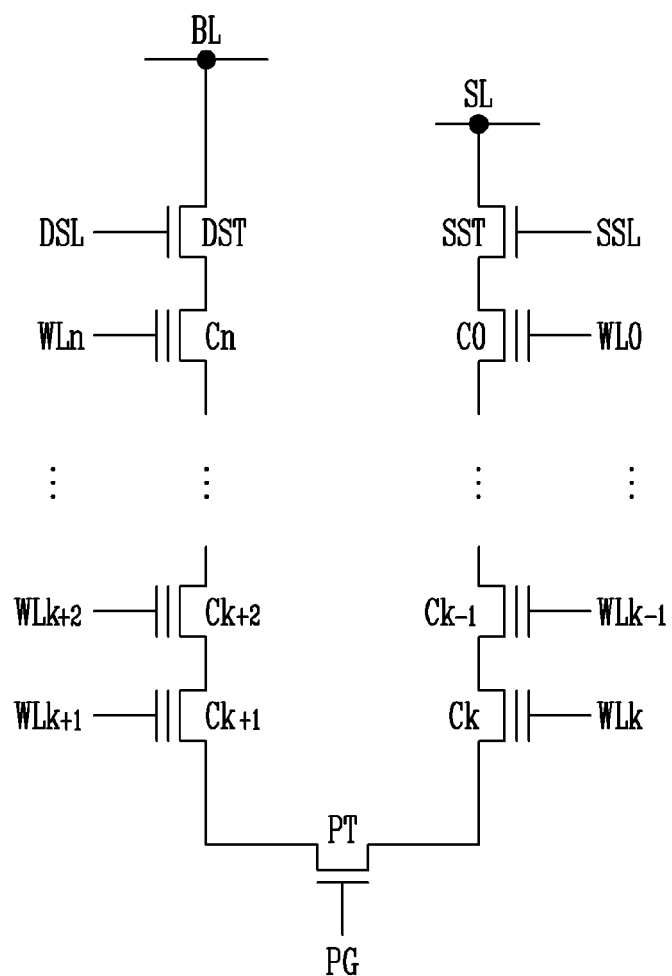

FIGS. 2A and 2B are views of a memory string in the memory block of FIG. 1. FIG. 3 is a plan view of a memory block of an embodiment of a semiconductor device.

Referring to FIGS. 2A, 2B, and 3, a pipe gate PG, having a recess, is formed on a semiconductor substrate (not shown). A pipe channel layer PC is formed within the recess of the pipe gate PG. A plurality of vertical channel layers SP1, SP2 extend upwardly from an upper surface of the pipe channel layer PC. An upper end of a first vertical channel layer SP1 is connected to a source line SL. An upper end of a second vertical channel layer SP2 is connected to a bit line BL. The vertical channel layers SP1, SP2 may be formed of polysilicon.

A plurality of conductive layers DSL, $WL_{k+1}$-$WL_n$ are formed at different heights of the second vertical channel layer SP2. A plurality of conductive layers SSL, $WL_0$-$WL_k$ are formed at different heights of the first vertical channel layer SP1. A multilayer (not shown) having a chargestorage layer is formed on a surface of the vertical channel layers SP1, SP2 and on a surface of the pipe channel layer PC, The multilayer is located between the vertical channel layers SP1, SP2 and the conductive layers DSL, $WL_{k+1}$-$WL_n$, SSL, $WL_0$-$WL_k$ and between the pipe channel layer PC and the pipe gate PG.

An uppermost conductive layer covering the second vertical channel layer SP2 may be used as a drain select line DSL. The conductive layers disposed between the drain select line DSL and the pipe channel layers may be used as word lines $WL_{k+1}$-$WL_n$. Some conductive layers used as word lines may be used as dummy word lines. An uppermost conductive layer covering the first vertical channel layer SP1 may be used as a source select line SSL. The lower conductive layers disposed between the source select line SSL and the pipe channel layer PC may be used as word lines $WL_0$-$WL_k$. Some conductive layers used as word lines may be used as dummy word lines.

The first set of conductive layers SSL, $WL_0$-$WL_k$ and the second set of conductive layers DSL, $WL_{k+1}$-$WL_n$ are stacked on different areas of the semiconductor substrate. The first vertical channel layer SP1 extending through the first set of conductive layers SSL, $WL_0$-$WL_k$ extends vertically between the source line SL and the pipe channel layer PC. The second vertical channel layer SP2 extending through the second set of conductive layers DSL, $WL_{k+1}$-$WL_n$ extends vertically between the bit line BL and the pipe channel layer PC.

A drain select transistor DST is formed in a section where the second vertical channel layer SP2 extends through the drain select line DSL. The main cell transistors $C_{k+1}$-$C_n$ are formed in the sections where the second vertical channel layer SP2 extends through the word lines $WL_{k+1}$-$WL_n$. A source select transistor SST is formed in a section where the first vertical channel layer SP1 extends through the source select line SSL. The main cell transistors $C_0$ to $C_k$ are formed in the sections where the first vertical channel layer SP1 extends through the word lines $WL_0$-$WL_k$.

The memory string may include the drain select transistor DST and the main cell transistors $C_{k+1}$-$C_n$ connected to the substrate in a vertical configuration between the bit line BL and the pipe channel layer PC, and the source select transistor SST and the main cell transistors $C_0$-$C_k$ connected to the substrate in a vertical configuration between the source line SL and the pipe channel layer PC. A dummy cell transistor (not shown) may be connected between the select transistor DST or SST and the main cell transistor $C_n$ or $C_0$. A dummy cell transistor (not shown) may be connected between the main cell transistor $C_{k+1}$ or $C_k$ and a pipe transistor PT.

The source select line SSL and the word lines WL0-WL7 formed of a conductive layer may be defined as a first set of stacked structures. The drain select line DSL and the word lines WL8-WL15 formed of a conductive layer may be defined as a second set of stacked structures. An insulating layer may be formed between the source select line SSL and the word lines WL0-WL7, and an insulating layer may be formed between the drain select line DSL and the word lines WL8-WL15.

The first set of stacked structures SSL, WL0-WL7 and second set of stacked structures DSL, WL8-WL15 in the memory block are disposed as a finger structure with which components are engaged. For example, the lengths of the drain select line DSL and the word lines WL8-WL15 are arranged in a generally parallel configuration with respect to each other. The length of the bit line BL is generally perpendicular with respect to the lengths of the drain select line DSL and the word lines WL8-WL15. The source select line SSL and the word lines WL0-WL7 are disposed between the drain select line DSL and the word lines WL8-WL15 in a generally parallel configuration. The source select line SSL and the word lines WL0-WL7 are connected with one another via an associated edge. The drain select line DSL and the word lines WL8-WL15 are connected with one another via an associated opposite edge. Edges of the first set of stacked structures SSL and WL0-WL7, and edges of the second set of stacked structures DSL and WL8-WL15 are formed in a step shape using a slimming process.

The source line SL is formed on the first set of stacked structures SSL, WL0-WL7 between the second set of stacked structures DSL, WL8-WL15, and connected to the first vertical channel layer SP1 that extends through the first set of stacked structures SSL, WL0-WL7. Two memory strings ST are electrically coupled to a bit line BL in the memory block. The memory strings ST are arranged in a zigzag fashion. The first and second vertical channel layers SP1 and SP2 are also arranged in a zigzag fashion.

Referring to FIGS. 1 and 2B, the operation circuits 120, 130, 140 are configured to execute a program loop, an erase loop, and a read operation of the memory cell transistor C0 connected to the selected word line (e.g. WL0). The program loop includes a program operation and a verify operation. The erase loop includes an erase operation and a verify operation. The operation circuits 120, 130, 140 may execute the program operation (or a post-program operation), following the erase loop, to control an erase level in which threshold voltages of the memory cells are distributed.

In order to execute the program loop, the erase loop, and the read operation, the operation circuits 120, 130, 140 are configured to selectively output operation voltages to the local lines SSL, WL0-WLn, DSL and the source line SL of the selected memory block, and to control the precharge/discharge of the bit lines BL or to sense a current flow of the bit lines BL.

In a NAND flash memory device, an operation circuit includes a control circuit 120, a voltage supply circuit 130, and a read/write circuit 140. The control circuit 120 issues commands to the voltage supply circuit 130 to generate and apply operation voltages for executing the program loop, the erase loop, and the read operation in response to a command signal received from an external device to the local lines SSL, WL0-WLn, DSL and the source line SL of the selected memory block. The control circuit 120 issues commands to the read/write circuit 140 to manage the precharge/discharge of the bit lines BL or to sense a current flow of the bit lines BL in order to execute the program loop, the erase loop, and the read operation.

The voltage supply circuit 130 generates operation voltages according to the program loop, the erase loop, and the read operation of the memory cells under the management of the control circuit 120. The operation voltages may include, but are not limited to, a program voltage, a read voltage, an erase voltage, a pass voltage, a select voltage, and a common source voltage. The operation voltages are supplied to the local lines SSL, WL0-WLn, DSL and the source line SL of the selected memory block in response to a row address signal generated by the control circuit 120.

The read/write circuit 140 may include a plurality of page buffers (not shown) electrically coupled to the memory array 110 via the bit lines BL. For example, each page buffer may be electrically coupled to an associated bit line. When the program operation is executed, the page buffers selectively precharge the bit lines BL according to a control signal generated by the control circuit 120 and the data for storage in the memory cells. When the program verify operation or the read operation is executed, after precharging the bit lines BL, the read/write circuit 140 senses a voltage change or current of the bit lines BL, and latches data read from the memory cell under the management of the control circuit 120.

Figure 4:
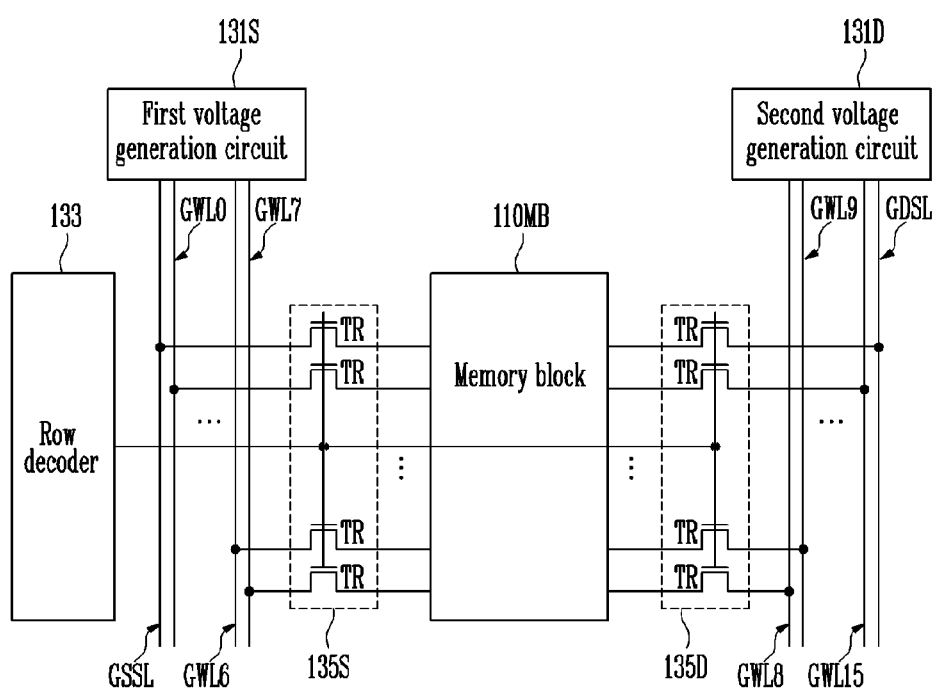
FIG. 4 is a circuit diagram representation of an embodiment of a semiconductor device.

Various embodiments of a method of connecting the operation circuits 120, 130, 140, and the memory block will be described below. FIG. 4 is a circuit diagram of an embodiment of a semiconductor device.

Referring to FIGS. 3 and 4, a voltage supply circuit configured to supply an operation voltage to a memory block 110MB may include voltage generation circuits 131S, 131D, a row decoder 133, and switching circuits 135S, 135D. The voltage generation circuits 131S, 131D are configured to supply operation voltages to global lines GDSL, GSSL, GWL0-GWL15 in response to one or more commands from the control circuit. The row decoder 133 is configured to generate a block select signal BLKWL for selecting the corresponding memory block 110MB in response to a row address signal generated by the control circuit.

The switching circuits 135S, 135D electrically couple the global lines GDSL, GSSL, GWL0-GWL15 and the local lines DSL, SSL, $WL_0$-$WL_n$ of the memory block 110MB to transmit the operation voltages to the local lines SSL, $WL_0$-$WL_n$, DSL of the selected memory block 110MB in response to the block select signal BLKWL. The switching circuits 135S, 135D may include switching devices TR configured to be connected between the global lines GDSL, GSSL, GWL0-GWL15 and the local lines DSL, SSL, $WL_0$-$WL_n$, and to operate in response to the block select signal BLKWL.

In order to connect the global lines GDSL, GSSL, GWL0-GWL15 and the local lines DSL, SSL, $WL_0$-$WL_n$, the switching circuit 135S may be connected to an edge of the first set of stacked structures SSL and WL0-WL7, and the switching circuit 135D may be connected to an edge of the second set of stacked structures DSL and WL8-WL15. The switching circuits 135S, 135D and the global lines GDSL, GSSL, GWL0, GWL15 may be disposed on either side of the memory block 110MB.

For example, the switching circuit 135S and the global lines GSSL, GWL0-GWL7 are disposed on one side of the memory block 110MB, and the switching circuit 135S is connected with a step-shaped end of the first set of stacked structures SSL, WL0-WL7. The switching circuit 135D and the global lines GDSL, GWL8-GWL15 are disposed on the other side of the memory block 110MB, and the switching circuit 135D is connected with a step-shaped end of the set of second stacked structures DSL, WL8-WL15. A wire operable to transmit the block select signal BLKWL may be connected with the switching circuit 135D located in the other side of the memory block 110MB passing an upper part of the memory block 110MB from the row decoder 133.

Figure 5:
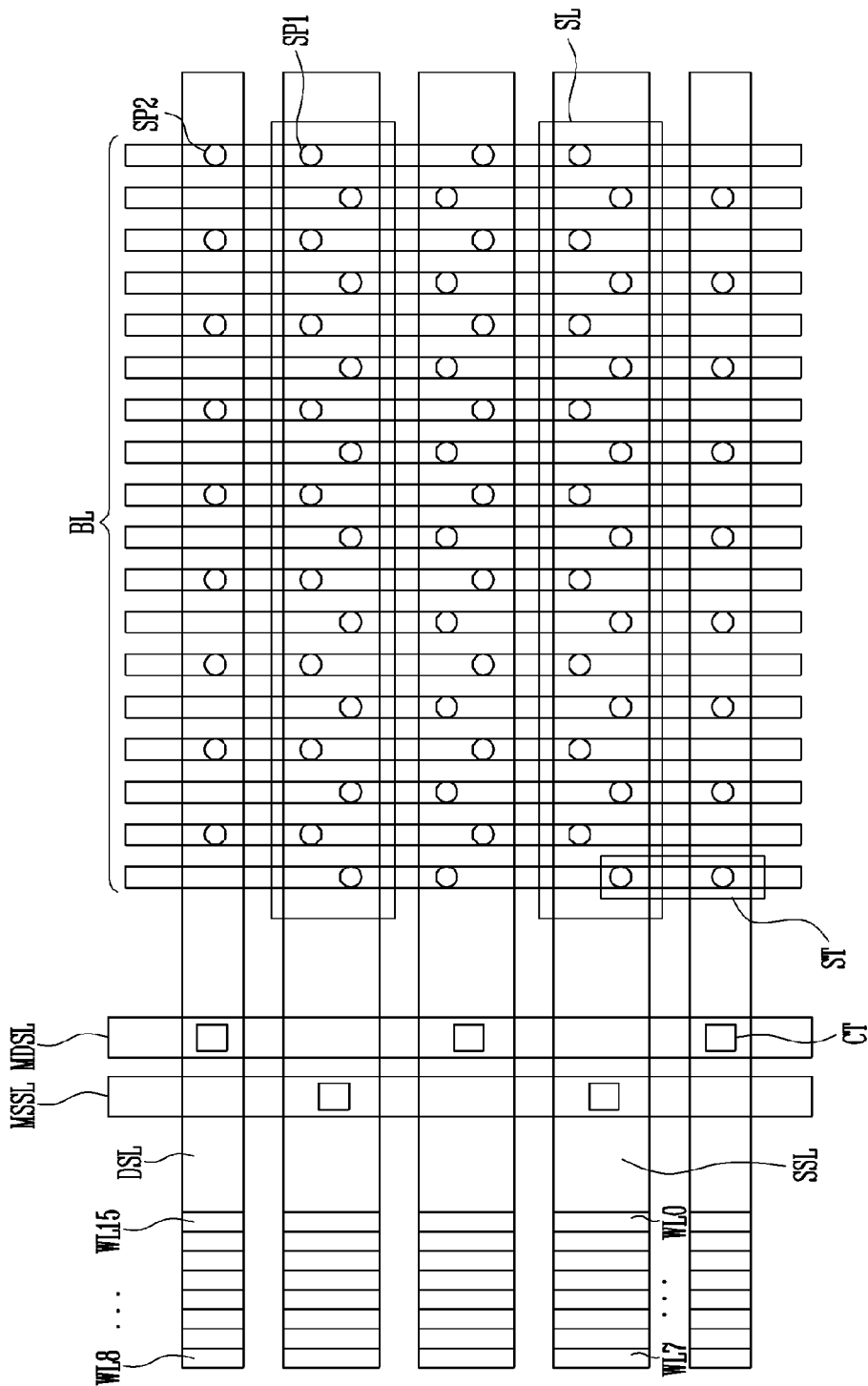
FIGS. 5 to 7 are views of a memory block of an embodiment of a semiconductor device.
Figure 6:
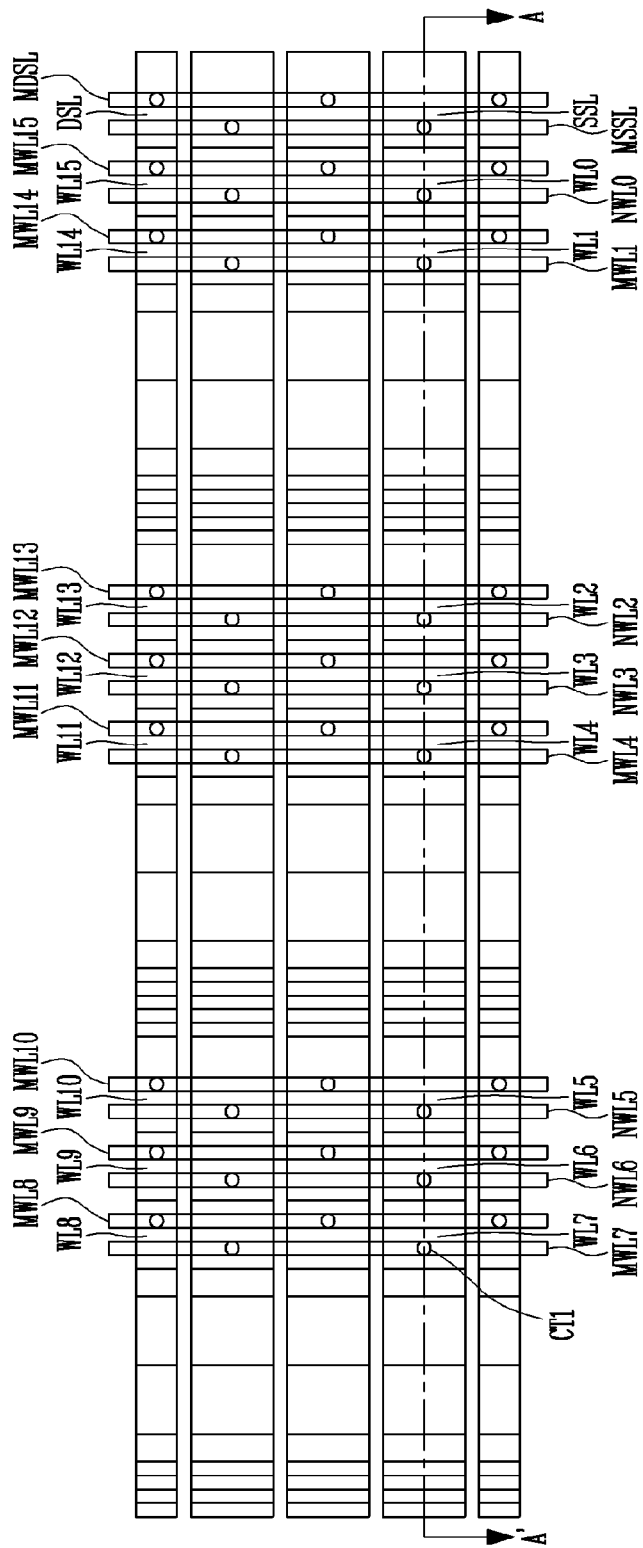
Figure 7:
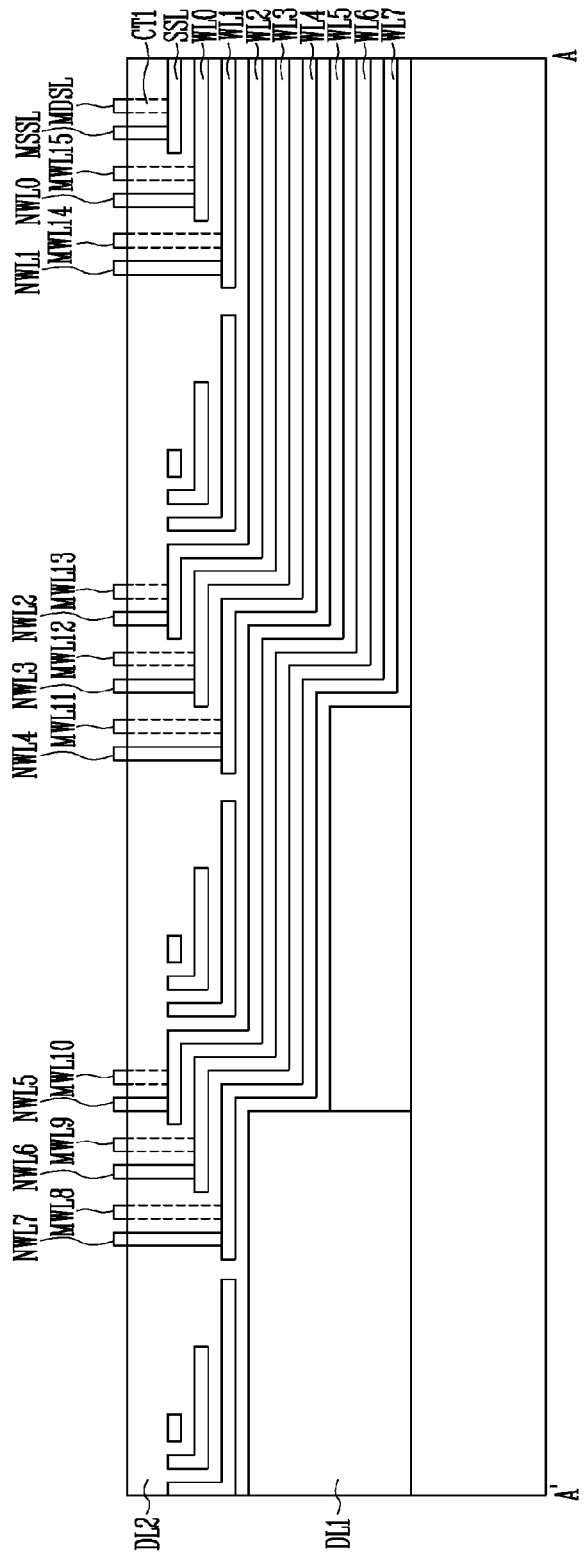

FIGS. 5 to 7 are views of an embodiment of a memory block of a semiconductor device.

Referring to FIG. 5, a memory block includes a first set of stacked structures SSL, WL0-WL7 and a second set of stacked structures DSL, WL8-WL15. The first set of stacked structures SSL, WL0, WL7 include insulating layers (not shown) and conductive layers that are alternately stacked on a substrate (not shown), and arranged in a generally parallel configuration with respect to each other. The second set of stacked structures DSL, WL8-WL15 include insulating layers (not shown) and conductive layers that are alternately stacked on the substrate between first set of stacked structures SSL, WL0-WL7 and arranged in a generally parallel configuration with respect to each other. The second set of stacked structures DSL, WL8-WL15 may include an odd number of stacked structures DSL, WL8-WL15 and the first set of stacked structures SSL, WL0-WL7 may include an even number of stacked structures SSL, WL0-WL7. The first set of stacked structures SSL, WL0-WL7 may be arranged between the second set of stacked structures DSL, WL8-WL15 in a generally parallel configuration.

The vertical channel layers SP1, SP2, the bit lines BL, and the source line SL in FIG. 5 may be formed in substantially the same configuration as shown in FIG. 3. The embodiment shown in FIG. 5 is different from the embodiment shown in FIG. 3 in that the first set of stacked structures SSL, WL0-WL7 as well as the second set of stacked structures DSL, WL8-WL15 are separated from one another without being connected at an edge.

For example, the lengths of drain select line DSL and the word lines WL8-WL15 are arranged in a in a generally perpendicular configuration with respect to the length of the bit line. The lengths of the source select line SSL and the word lines WL0-WL7 are disposed between the drain select line DSL and the word lines WL8-WL15 in a generally parallel configuration.

Edges of the first set of stacked structures SSL, WL0-WL7 and the second set of stacked structures DSL, WL8-WL15 are formed in a step shape using a slimming process. Both sides of the first set of stacked structures SSL, WL0-WL7 and the second set of stacked structures DSL, WL8-WL15 may be formed in a step shape using the slimming process. The edges of the first set of stacked structures SSL, WL0-WL7 and the second set of stacked structures DSL, WL8-WL15 heading for an operation circuit, such as for example a voltage supply circuit or a switching circuit, may be formed in a step shape using the slimming process.

Since the first set of stacked structures SSL, WL0-WL7 and the second set of stacked structures DSL, WL8-WL15 are disposed separately from each other, wiring structures MSSL, MDSL may be used to electrically couple the first set of stacked structures SSL, WL0-WL7 with one another and the second stacked structures DSL, WL8-WL15 with one another. A wiring structure (not shown) may be used to electrically couple the wiring structures MSSL, MDSL with the operation circuit (e.g. a switching circuit).

The wiring structures electrically couple the stacked structures with one another at an edge of the stacked structures formed in a step shape by the slimming process. Referring to FIGS. 6 and 7, the first wiring structure MSSL, MWL0-MWL7 connects the conductive layers located on the same layer in different first set of stacked structures SSL, WL0-WL7. The first wiring structure MSSL, MWL0-MWL7 connects the ends of the conductive layers of the first set of stacked structures SSL, aWL0-WL7 heading for the operation circuit with one another. The conductive layers of the first set of stacked structures SSL, WL0-WL7 correspond to the source select line SSL and the word lines WL0-WL7. The second wiring structure MDSL, MWL8-MWL15 connects the conductive layers located on the same layer of different stacked structures of the second set of stacked structures DSL, WL8-WL15. The second wiring structure MDSL, MWL8-MWL15 connects ends of the conductive layers of the second set of stacked structures DSL, WL8-WL15 heading for the operation circuit with one another. The conductive layers of the second set of stacked structures DSL, WL8-WL15 correspond to the drain select line DSL and the word lines WL8-WL15.

The uppermost conductive layers in the first set of stacked structures SSL and WL0-WL7 and the second set of stacked structures DSL, WL8-WL15 may be used as the select lines DSL and SSL, respectively. The other the conductive layers may be used as the word lines WL0-WL15. The uppermost conductive layers of the first set of stacked structures SSL, WL0-WL7 may be used as the source select lines SSL, and the uppermost conductive layers of the second set of stacked structures DSL, WL8-WL15 may be used as the drain select lines DSL.

In order to generate a step height in lower edges of the first set of stacked structures SSL, WL0-WL7 and the second set of stacked structures DSL, WL8-WL15 heading for the operation circuit, step-shaped insulating layers DL1 may be formed on the lower edges of the first set of stacked structures SSL, WL0-WL7 and the set of second stacked structures DSL, WL8-WL15.

The ends of the conductive layers in the first set of stacked structures SSL, WL0-WL7 and the second set of stacked structures DSL, WL8-WL15 may be separately located on an area without the step-shaped insulating layer DL1 and on the horizontal parts of the step-shaped insulating layer DL1. The ends of the conductive layers SSL, WL0-WL7, DSL, WL8-WL15 are located in a step shape on the area without the step-shaped insulating layer DL1 and on the horizontal parts of the step-shaped insulating layer DL1.

The ends of the conductive layers SSL, WL2, WL5 may be located at the same height of different areas by the step-shaped insulating layer DL1. The ends of the conductive layers WL0, WL3, WL6 may be located at the same height of different areas, and the ends of the conductive layers WL1, WL4, WL7 may be located at the same height of different areas. The contact plugs CT1 connected with the conductive layers SSL, WL0-WL7 within an interlayer insulating layer DL2 may be formed with a small depth.

Figure 8:
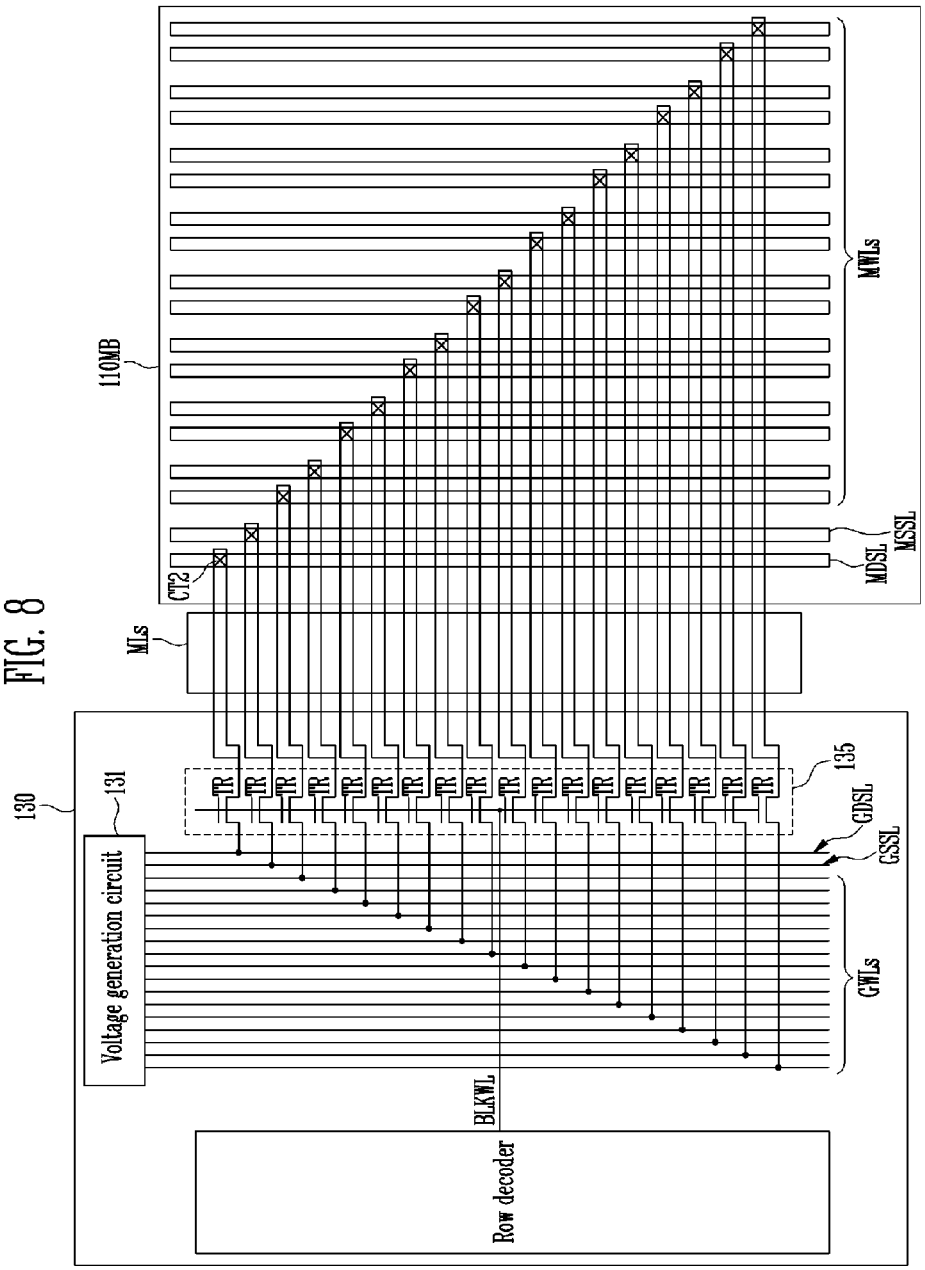
FIGS. 8 and 9 are circuit diagram representations of an embodiment of a memory block and an operation circuit.
Figure 9:
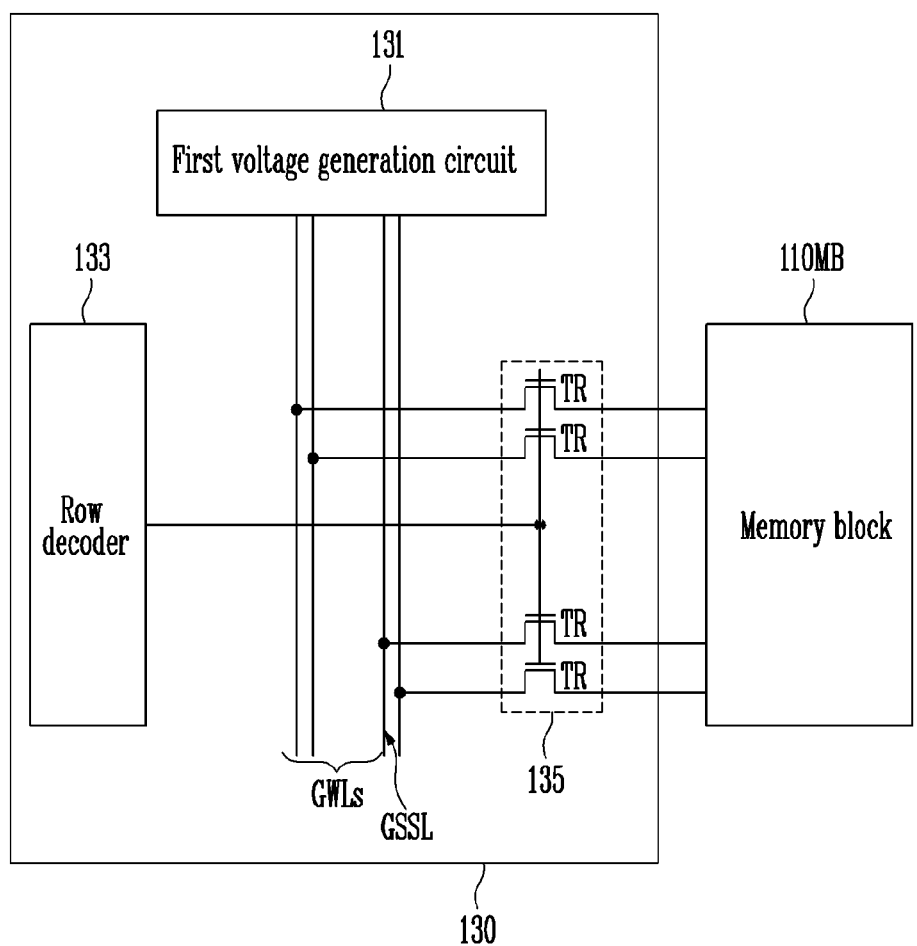

A method of connecting a memory block and an operation circuit will be described below. FIGS. 8 and 9 are circuit diagrams used to describe an embodiment of a method of connecting a memory block and an operation circuit.

The first and second wiring structures MDSL, MSSL, MWLs are electrically coupled with the operation circuit (for example, a switching circuit) 135 via a third wiring structure MLs. The third wiring structure MLs is formed on relatively higher layer than the first and second wiring structures MDSL, MSSL, MWLs, and electrically coupled to the first and second wiring structures MDSL, MSSL, MWLs via contact plugs CT2. For example, the first and second wiring structures MDSL, MSSL, MWLs may be formed on the same layer as the source line, and the third wiring structure MLs may be formed on the same layer as the bit lines BL.

Since the first and second wiring structures MDSL, MSSL, MWLs are formed on a single edge of the first set of stacked structures SSL, WL0-WL7 and the second set of stacked structures DSL, WL8-WL15, the operation circuit, such as for example, a voltage supply circuit 130 may be disposed on a single edge of the memory block 110MB.

Figure 10:
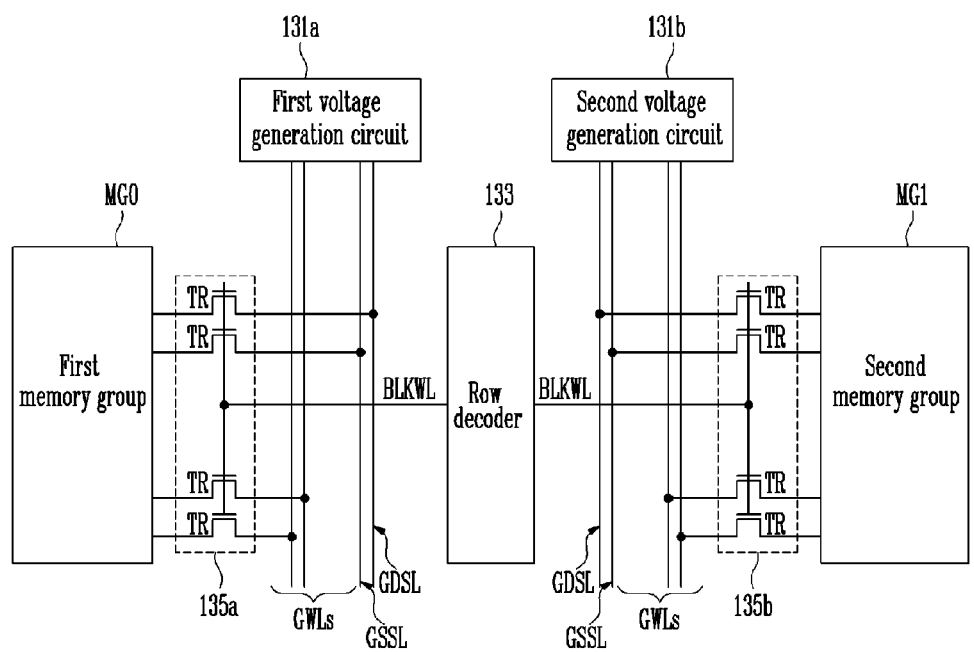
FIGS. 10 and 11 are circuit diagram representations a memory block and an operation circuit.
Figure 11:
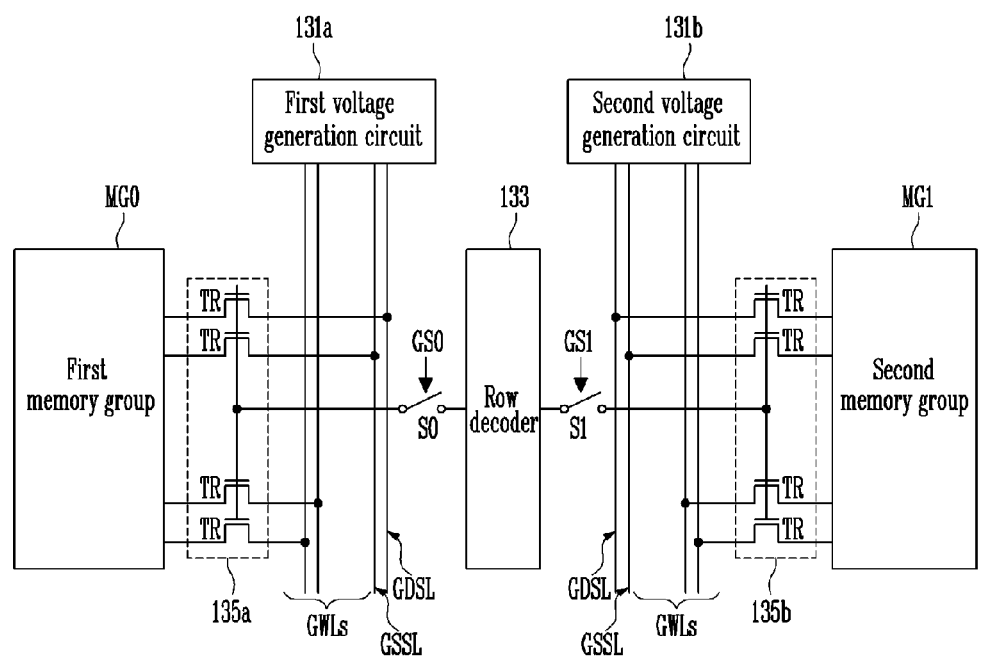

FIGS. 10 and 11 are circuit diagrams for describing an example of a method of connecting an embodiment of a memory block and an operation circuit.

The operation circuits, such as for example, a row decoder and switching circuits 133, 135a, 135b, are disposed between first and second memory groups MG0, MG1.

The first memory group MG0 may include symmetrical first and second set of stacked structures SSL, WL0-WL7, DSL, WL8-WL15 that are substantially similar to those shown in FIGS. 5, 6 and 7. The first memory group MG0 may include wiring structures MSSL, MWL0-MWL7, MDSL and MWL8-MWL15 that are substantially similar to those shown in FIG. 6, with the step-shaped ends of the conductive layers located on the same layer of different stacked structures of the first set of stacked structures that may be connected via the first wiring structure, and step-shaped ends of the conductive layers located on the same layer of different stacked structures of the second set of stacked structures that may be connected via the second wiring structure. Similar to the third wiring structure MLs, shown in FIG. 8, the first and second wiring structures of the first memory group MG0 may be electrically coupled with the operation circuit between the first and second memory groups MG0 and MG1 via the third wiring structure. An example of such an operation circuit is a switching circuit 135a.

The second memory group MG1 may include third and fourth stacked structures having substantially similar configurations as the first and second stacked structures SSL, WL0-WL7, DSL, WL8-WL15 shown in FIGS. 5, 6 and 7. The second memory group MG1 includes wiring structures, similar to the wiring structures MSSL, MWL0-MWL7, MDSL, MWL8-MWL15 shown in FIG. 6. The step-shaped ends of the conductive layers may be located on the same layer of different stacked structures of the third set of stacked structures that may be connected via the fourth wiring structure, and the step-shaped ends of the conductive layers located on the same layer of different stacked structures of the fourth set of stacked structures may be connected via the fifth wiring structure. As shown in the third wiring structure MLs in FIG. 8, the fourth and fifth wiring structures of the second memory group MG1 may be electrically coupled with the operation circuit between the first and second memory groups MG0 and MG1 via the sixth wiring structure. An example of such an operation circuit is a switching circuit 135b.

The locations and connections associated with the row decoder 133, a second voltage generation circuit 131b, the switching circuit 135b, and the second memory group MG1 may be substantially similar to the locations and connections associated with the row decoder 133, the voltage generation circuit 131, the switching circuit 135, and the memory block 110MB shown in FIGS. 6, 7, 8 and 9. The locations and connections associated with the row decoder 133, a first voltage generation circuit 131a, the switching circuit 135a, and the first memory group MG0 may be symmetrical with respect to the locations and connections associated with the row decoder 133, the voltage generation circuit 131, the switching circuit 135, and the memory block 110MB shown in FIGS. 6, 7, 8 and 9.

A block select signal BLKWL generated by the row decoder 133 may be transmitted substantially simultaneously to the first memory group MG0 and to the second memory group MG1.

Since the memory block has a 3-dimensional structure, and is electrically coupled via the operation circuit and the wiring structures located on one side as shown in FIGS. 5, 6 and 7, the operation circuit may be disposed between the memory groups of the 3-dimensional structure. The memory groups and the operation circuit may be electrically coupled via the wiring structures shown in FIG. 10. The implementation of such a configuration may result in the reduction of an area occupied by the operation circuit.

Referring to FIG. 11, switching devices S0, S1 are configured to transmit a block select signal BLKWL to the operation circuit in response to a first group select signal GS0 and a second group select signal GS1. The first switching device S0 may be connected between a first output terminal of the row decoder 133 and the switching circuit 135a, and may be configured to operate according to the first group select signal GS0. The second switching device S1 may be connected between a second output terminal of the row decoder 133 and the switching circuit 135b, and may be configured to operate according to the second group select signal GS1. The first and second group select signals GS0, GS1 may be generated by a control circuit in response to an address signal input received from an external device. The first and second group select signals GS0, GS1 may be signals where one signal is the inverse of the other signal or may be the same signal.

The block select signal BLKWL may be transmitted to one of the memory groups from among the memory groups MG0, MG1 via the switching devices S0, S1, or to both the memory groups MG0, MG1. As a result, a single memory group from among the memory groups MG0, MG1 may operate, or all of the memory groups MG0, MG1 may operate.

Referring to FIGS. 10 and 11, global lines GDSL, GSSL, GWLs that are electrically coupled to the first memory group MG0 and global lines GDSL, GSSL, GWLs that are electrically coupled to the second memory group MG1 are electrically coupled with one another, and one of the voltage generation circuits from among the voltage generation circuits 131a, 131b may be omitted.

Figure 12:
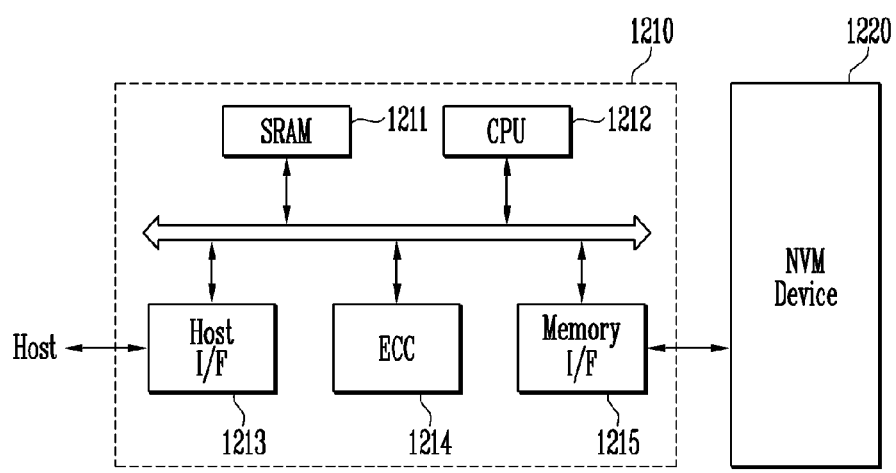
FIG. 12 is a block diagram representation of an embodiment of a memory system.

Referring to FIG. 12 a block diagram representation of an embodiment of a memory system 1200 is shown.

The memory system 1200 includes a non-volatile memory device 1220 and a memory controller 1210. In an embodiment, the non-volatile memory device 1220 may include the components of the semiconductor device having the memory block shown in FIG. 5 and the operation circuit shown in FIG. 9. In an embodiment, the non-volatile memory device 1220 may be include the components of the semiconductor device having the memory block shown in FIG. 7 and the operation circuit shown in FIG. 9.

The memory controller 1210 may be configured to manage one or more operations of the non-volatile memory device 1220. A solid state disk (SSD), such as for example, a memory card or a semiconductor disk device, in combination with the non-volatile memory device 1220 and the memory controller 1210 will be provided. A static random access memory (SRAM) 1211 is configured to be used as an operation memory of a processing unit 1212. A host interface 1213 is configured to use a data exchanging protocol to create an interface with a host Host in the memory system 1200. An error correction block 1214 is configured to detect and correct an error that may be present in a data readout from the non-volatile memory device 1220. A memory interface 1215 is configured to interface with the non-volatile memory device 1220. The central processing unit 1212 is configured to execute operations associated with the exchange of data involving the memory controller 1210.

The memory system 1200 includes a read only memory (ROM) (not shown), and/or other components that may be configured to store code data for interfacing with the host Host. The non-volatile memory device 1220 may be provided as a multi-chip package including a plurality of flash memory chips. The memory system 1200 may be used as a storage media that may have a relatively low occurrence of errors and relatively higher reliability. Embodiments of the flash memory device may be a component of a memory system, such as for example a semiconductor disk device. An example of a semiconductor disk device is a solid state disk (SSD). In such a case, the memory controller 1210 may be configured to communicate with an external device, such as for example a host using one or more different interface protocols. Examples of such interface protocols include, but are not limited to, a Universal Serial Bus (USB) protocol, a MultiMediaCard (MMC) protocol, a Peripheral Component Interconnect Express (PCI-E) protocol, a Serial Advanced Technology Attachment (SATA) protocol, a Parallel-ATA protocol, an Enhanced Small Disk Interface (ESDI) protocol, and an Integrated Drive Electronics (IDE) protocol.

Figure 13:
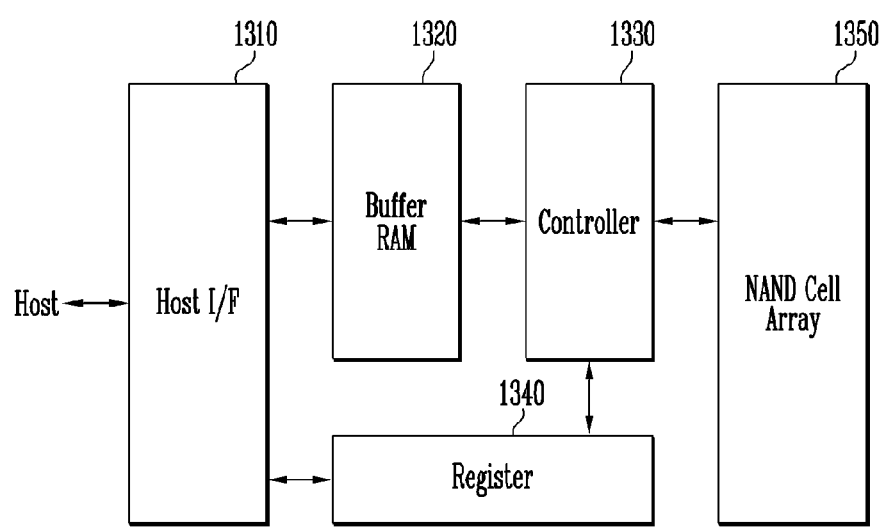
FIG. 13 is a block diagram representation of an embodiment of a fusion memory device or a fusion memory system configured to execute a program operation.

FIG. 13 is a block diagram representation of an embodiment of a fusion memory device or a fusion memory system configured to execute a program operation. For example, the technical characteristics of the semiconductor device described above may be applied to a OneNAND flash memory device 1300 as a fusion memory device.

The OneNAND flash memory device 1300 may include a host interface 1310, a buffer RAM 1320, a control unit 1330, a register 1340, and a NAND flash cell array 1350. The host interface 1310 may be configured to exchange information with a device using one or more different protocols. The buffer RAM 1320 may be configured to store built-in code for driving the memory device or to temporarily store data. The control unit 1330 may be configured to control a read, a program, and one or more different statuses in response to a control signal and command received from an external device. The register 1340 may be configured to store data including, for example, a command, an address, a configuration operable to define a system operating environment of the ithe memory device. The NAND flash cell array 1350 may include an operation circuit including a non-volatile memory cell and a read/write circuit. The memory array of the NAND flash cell array 1350 may include a memory array including the memory block shown in FIG. 7.

Figure 14:
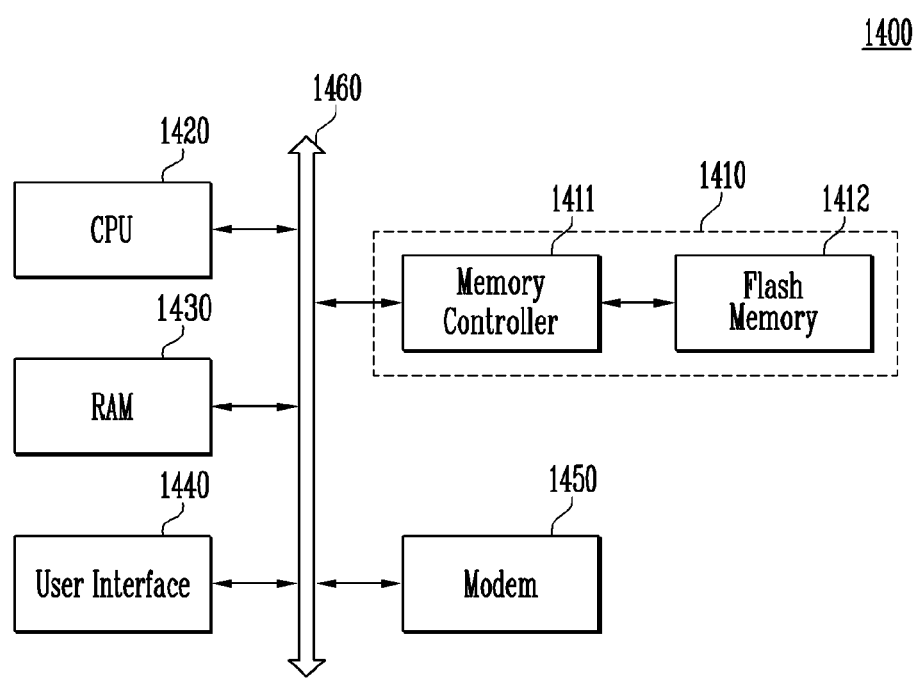
FIG. 14 is a block diagram representation of a computing system including an embodiment of a flash memory device.

FIG. 14 is a block diagram representation of a computing system including an embodiment of a flash memory device.

The computing system 1400 includes a microprocessor 1420, a RAM 1430, a user interface 1440, a modem 1450, and a memory system 1410 electrically coupled to a system bus 1460. An example of a modem 1450 is a baseband chipset. When the computing system 1400 is a mobile device, the computing system 1400 includes a battery (not shown) for supplying an operation voltage to the computing system 1400. The computing system 1400 may include one or more of an application chipset, a camera image processor (CIS), a mobile dynamic random access memory (DRAM). The memory system 1410 may, for example, be a solid state drive/disk (SSD) that uses the above-described semiconductor device to store data. Alternatively, the memory system 1410 may be a fusion flash memory. An example of a fusion flash memory is an OneNAND flash memory.

While certain embodiments have been described above, it will be understood to those skilled in the art that the embodiments described are by way of example only. Accordingly, the semiconductor memory devices including memory blocks and the systems including semiconductor memory devices including memory blocks described herein should not be limited based on the described embodiments. Rather, the semiconductor memory devices including memory blocks and the systems including semiconductor memory devices including memory blocks described herein should only be limited in light of the claims that follow when taken in conjunction with the above description and accompanying drawings.

What is claimed is:

1. A semiconductor device, comprising:
   a first set of stacked structures including alternately stacked insulating layers and conductive layers, wherein the alternately stacked layers are disposed on a substrate, and arranged in a generally parallel configuration with respect to each other;
   a second set of stacked structures including alternately stacked insulating layers and conductive layers, wherein the alternately stacked layers are disposed on the substrate between the first stacked structures, and arranged in a generally parallel configuration with respect to each other;
   a first wiring structure configured to electrically couple conductive layers disposed on the same layer of different stacked structures of the first set of stacked structures;
   a second wiring structure configured to electrically couple conductive layers disposed on the same layer in different second stacked structures of the second set of stacked structures; and
   a third wiring structure configured to electrically couple the first wiring structure and the second wiring structure with an operation circuit.

2. The semiconductor device of claim 1, wherein uppermost conductive layers of the conductive layers included in the first set of stacked structures and in the second set of stacked structures are configured to be used as select lines,
   and the other conductive layers are configured to be used as word lines.

3. The semiconductor device of claim 2, wherein the uppermost conductive layers of the first set of stacked structures are configured to be used as drain select lines, and
   the uppermost conductive layers of the second set of stacked structures are configured to be used as source select lines.

4. The semiconductor device of claim 1, further comprising:
   first vertical channel layer configured to extend through the conductive layers of the first set of stacked structures; and
   second vertical channel layer are configured to extend through the conductive layers of the second set of stacked structures.

5. The semiconductor device of claim 4, further comprising a pipe channel layer formed on the substrate, and configured to electrically couple the first vertical channel layer with the second vertical channel layer, wherein to first vertical channel layer is adjacent to the second vertical channel layer.

6. The semiconductor device of claim 1, wherein the first wiring structure is configured to electrically couple ends of the conductive layers of the first set of stacked structures heading for the operation circuit with one another, and
   the second wiring structure is configured to electrically couple ends of the conductive layers of the second set of stacked structures heading for the operation circuit with one another.

7. The semiconductor device of claim 1, further comprising step-shaped insulating layers formed in lower edges of the first and second set of stacked structures to generate a step height in the lower edges of the first and second set of stacked structures heading for the operation circuit.

8. The semiconductor device of claim 7, wherein ends of the conductive layers included in the first and second set of stacked structures are located on first and second areas without the step-shaped insulating layer and on horizontal parts of the step-shaped insulating layer, wherein the first area is different from the second area.

9. The semiconductor device of claim 8, wherein the ends of the conductive layers are located in a step shape on the first and second areas without the step-shaped insulating layer and on the horizontal parts of the step-shaped insulating layer.

10. The semiconductor device of claim 7, wherein one or more of the conductive layers in the first and second set of stacked structures on an area without the step-shaped insulating layer are electrically coupled via the first and second wiring structures, and
    the other conductive layers in the first and second set of stacked structures on horizontal parts of the step-shaped insulating layer are electrically coupled via the first and second wiring structures.

11. A semiconductor device, comprising:
    a first memory group including first and second set of stacked structures including insulating layers and conductive layers alternately stacked on a substrate, wherein the stacked structures of the first set of stacked structures and the stacked structure of the second set of stacked structures are alternately arranged and wherein the stacked structures of the first set of stacked structures has a generally parallel configuration and the stacked structures of the second set of stacked structures has a generally parallel configuration;
    first and second wiring structures configured to electrically coupled conductive layers located on the same layer in different stacked structures of the first set of stacked structures, and to electrically couple conductive layers located on the same layer in different stacked structures of the second set of stacked structures;
    a second memory group including third and fourth set of stacked structures including insulating layers and conductive layers alternately stacked on the substrate, wherein the stacked structures of the third set of stacked structures and the stacked structures of the fourth set of stacked structures are alternately arranged and wherein the stacked structures of the third set of stacked structures has a generally parallel configuration and the stacked structures in the fourth set of stacked structures has a generally parallel configuration;
    fourth and fifth wiring structures configured to electrically couple conductive layers located on the same layer in different stacked structures of the third set of stacked structures, and to electrically couple conductive layers located on the same layer in different stacked structures of the fourth set of stacked structures;
    a third wiring structure configured to electrically couple the first and second wiring structures with an operation circuit located between the first and second memory groups; and
    a sixth wiring structure configured to electrically couple the fourth and fifth wiring structures with the operation circuit.

12. The semiconductor device of claim 11, wherein the first wiring structure is configured to electrically couple ends of the conductive layers of the stacked structures in the first set of stacked structures heading for the operation circuit,
    the second wiring structure is configured to electrically couple ends of the conductive layers of the stacked structures in the second set of stacked structures heading for the operation circuit,
    the fourth wiring structure is configured to electrically couple ends of the conductive layers of the stacked structures in the third set of stacked structures heading for the operation circuit, and the fifth wiring structure configured to electrically couple ends of the conductive layers of the stacked structures in the fourth set of stacked structures heading for the operation circuit.

13. The semiconductor device of claim 11, further comprising step-shaped insulating layers formed in lower edges of the stacked structures of the first, second, third and fourth set of stacked structures to generate a step height in the lower edges of the stacked structures of the first, second, third and fourth set of stacked structures heading for the operation circuit.

14. The semiconductor device of claim 13, wherein ends of the conductive layers included in the first, second, third and fourth stacked structures are located on first, second, third and fourth areas, respectively, without the step-shaped insulating layer and on horizontal parts of the step-shaped insulating layer, wherein the first, second, third and fourth areas are different areas.

15. The semiconductor device of claim 14, wherein the ends of the conductive layers are located in a step shape on the first, second, third and fourth areas without the step-shaped insulating layer and on the horizontal parts of the step-shaped insulating layer.

16. The semiconductor device of claim 13, wherein one or more of the conductive layers included in the first, second, third and fourth set of stacked structures are electrically coupled via the first, second, fourth, and fifth wiring structures on an area without the step-shaped insulating layer, and
the other conductive layers included in the first, second, third and fourth set of stacked structures are electrically coupled via the first, second, fourth, and fifth wiring structures on horizontal parts of the step-shaped insulating layer.

17. The semiconductor device of claim 11, wherein the operation circuit comprises:
a row decoder configured to output first and second block select signals;
a first switching circuit configured to electrically couple the third wiring structure and global lines of the first memory group in response to the first block select signal;
a second switching circuit configured to electrically couple the sixth wiring structure and global lines of the second memory group in response to the second block select signal;
a first switching device configured to transmit the first block select signal to the first switching circuit in response to a first group select signal; and
a second switching device configured to transmit the second block select signal to the second switching circuit in response to a second group select signal.

* * * * *